United States Patent
Kim

(10) Patent No.: US 8,148,734 B2
(45) Date of Patent: Apr. 3, 2012

(54) LIGHT EMITTING DEVICE HAVING A LATERAL PASSIVATION LAYER

(75) Inventor: Sun Kyung Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/241,984

(22) Filed: Sep. 23, 2011

(65) Prior Publication Data

US 2012/0012878 A1 Jan. 19, 2012

Related U.S. Application Data

(63) Continuation of application No. 13/016,217, filed on Jan. 28, 2011, now Pat. No. 8,071,973.

(30) Foreign Application Priority Data

Feb. 1, 2010 (KR) .................. 10-2010-0009211

(51) Int. Cl.
*H01L 27/15* (2006.01)
*H01L 29/26* (2006.01)
*H01L 31/12* (2006.01)
*H01L 33/00* (2010.01)
*H01L 29/22* (2006.01)
*H01L 29/06* (2006.01)
*H01L 31/0328* (2006.01)
*H01L 31/0336* (2006.01)
*H01L 31/072* (2012.01)
*H01L 31/109* (2006.01)

(52) U.S. Cl. ........ 257/79; 257/13; 257/94; 257/E33.001

(58) Field of Classification Search .................. 257/13, 257/79, 94, E33.001
See application file for complete search history.

(56) References Cited

U.S. PATENT DOCUMENTS

| 6,784,010 | B2 | 8/2004 | Yamaguchi et al. |
| 6,936,839 | B2 | 8/2005 | Taylor |
| 7,037,742 | B2 | 5/2006 | Slater et al. |
| 7,149,233 | B2 | 12/2006 | Furukawa et al. |
| 7,195,944 | B2 * | 3/2007 | Tran et al. ................ 438/46 |
| 7,323,724 | B2 | 1/2008 | Sugimoto et al. |
| 7,356,060 | B2 * | 4/2008 | Mochida ............... 372/43.01 |
| 7,420,217 | B2 * | 9/2008 | Jeon ............................ 257/89 |
| 7,470,555 | B2 | 12/2008 | Matsumura |
| 7,496,124 | B2 | 2/2009 | Kozaki et al. |

(Continued)

FOREIGN PATENT DOCUMENTS

EP 2 246 908 A2 11/2010

(Continued)

*Primary Examiner* — Ida M Soward

(74) *Attorney, Agent, or Firm* — McKenna Long & Aldridge LLP

(57) ABSTRACT

Provided are a light emitting device, a light emitting device package, and a lighting system. The light emitting device includes a light emitting structure including a first conductive type semiconductor layer, a second conductive type semiconductor layer, and an active layer between the first conductive type semiconductor layer and the second conductive type semiconductor layer, and a passivation layer protecting a surface of the light emitting structure. The passivation layer includes a first passivation layer on a top surface of the light emitting structure and a second passivation layer having a refractive index different from that of the first passivation layer, the second passivation layer being disposed on a side surface of the light emitting structure. The second passivation layer has a refractive index greater than that of the first passivation layer.

17 Claims, 8 Drawing Sheets

U.S. PATENT DOCUMENTS

| | | | |
|---|---|---|---|
| 7,515,623 B2 | 4/2009 | Watanabe et al. | |
| 7,629,633 B2 * | 12/2009 | Chan et al. | 257/263 |
| 7,646,798 B2 | 1/2010 | Michiue et al. | |
| 7,956,364 B2 * | 6/2011 | Yoo | 257/76 |
| 7,994,707 B2 * | 8/2011 | Aota | 313/504 |
| 2004/0197944 A1 * | 10/2004 | Chen et al. | 438/26 |
| 2005/0030999 A1 | 2/2005 | Yoneda | |
| 2005/0269579 A1 * | 12/2005 | Yukimoto et al. | 257/81 |
| 2009/0275159 A1 | 11/2009 | Tanisaka | |
| 2010/0029027 A1 * | 2/2010 | Ikuta et al. | 438/29 |
| 2010/0029030 A1 * | 2/2010 | Uchida et al. | 438/34 |
| 2010/0072501 A1 | 3/2010 | Wakai et al. | |
| 2010/0230698 A1 * | 9/2010 | Rode et al. | 257/98 |
| 2010/0232465 A1 * | 9/2010 | Tsukiji et al. | 372/45.01 |
| 2010/0237371 A1 | 9/2010 | Kang et al. | |
| 2010/0264443 A1 | 10/2010 | Wakai et al. | |
| 2011/0140152 A1 * | 6/2011 | Song | 257/98 |
| 2011/0186904 A1 * | 8/2011 | Harle et al. | 257/99 |

FOREIGN PATENT DOCUMENTS

| | | |
|---|---|---|
| EP | 2 262 011 A2 | 12/2010 |
| JP | 06252440 | 9/1994 |
| KR | 10-2009-0122833 A | 1/2009 |
| KR | 10-2009-0034590 A | 4/2009 |
| KR | 10-2009-0077425 A | 7/2009 |
| KR | 10-2009-0104931 A | 10/2009 |

* cited by examiner

[FIG. 1]
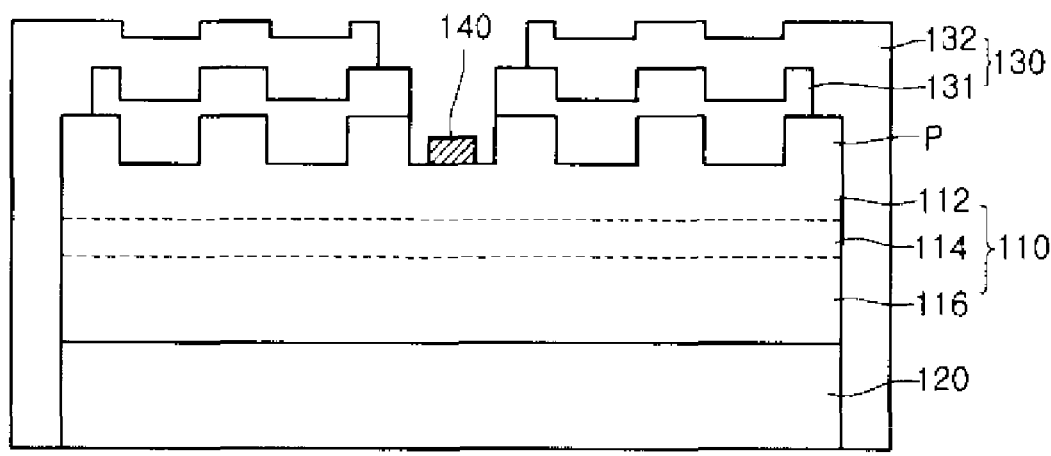
[FIG. 2]
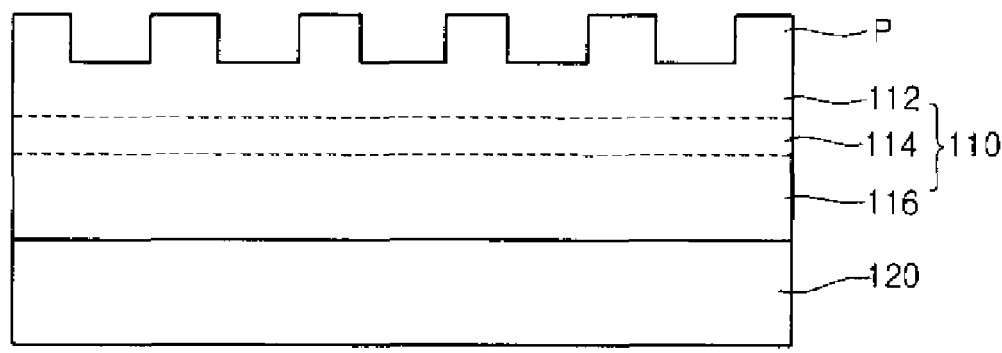

[FIG. 3]
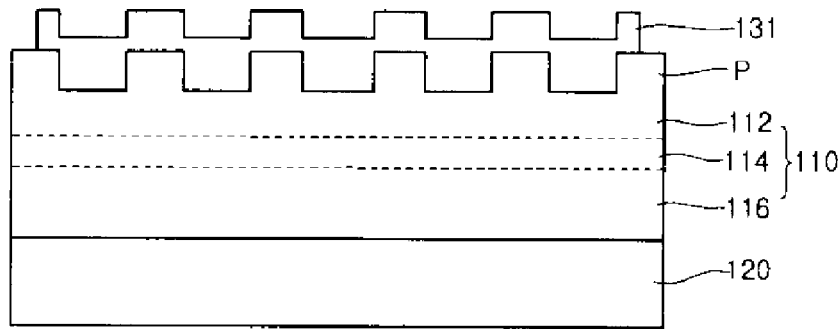
[FIG. 4]
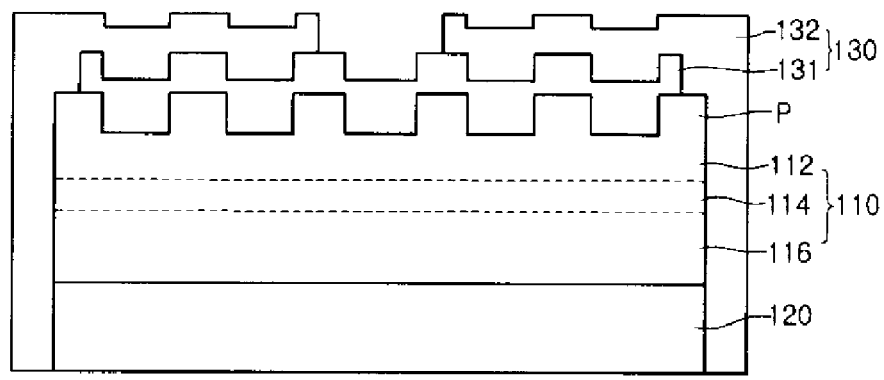
[FIG. 5]
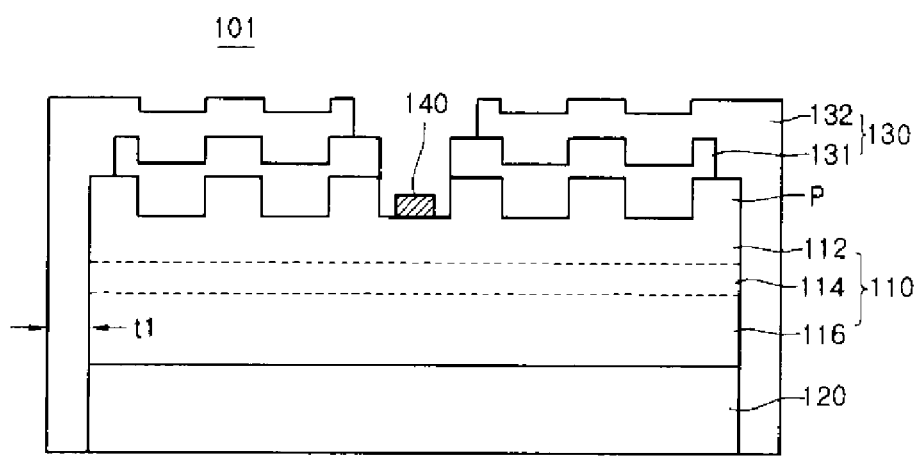

[FIG. 6]
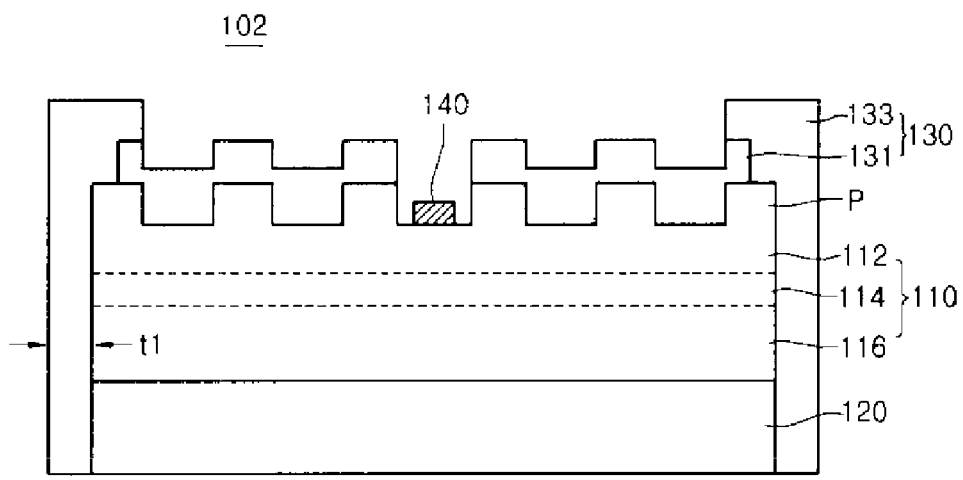
[FIG. 7]
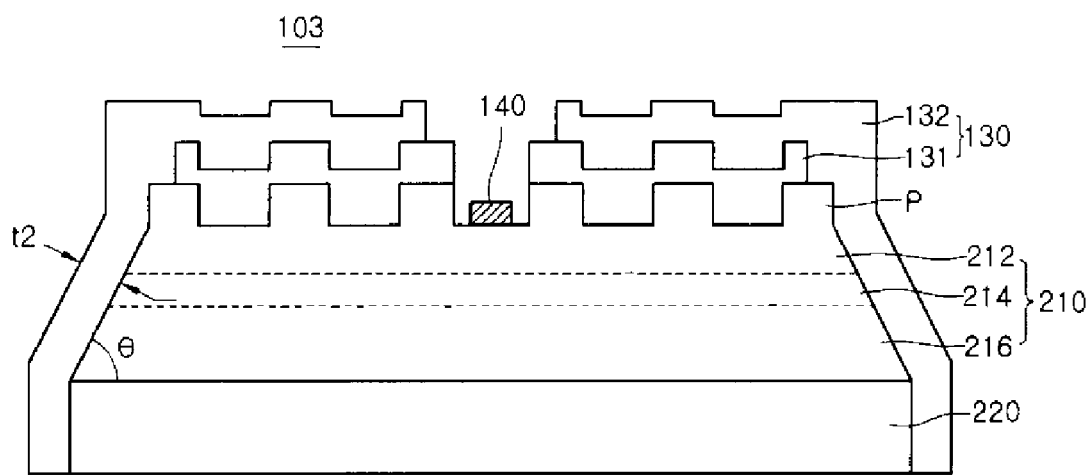

[FIG. 8]
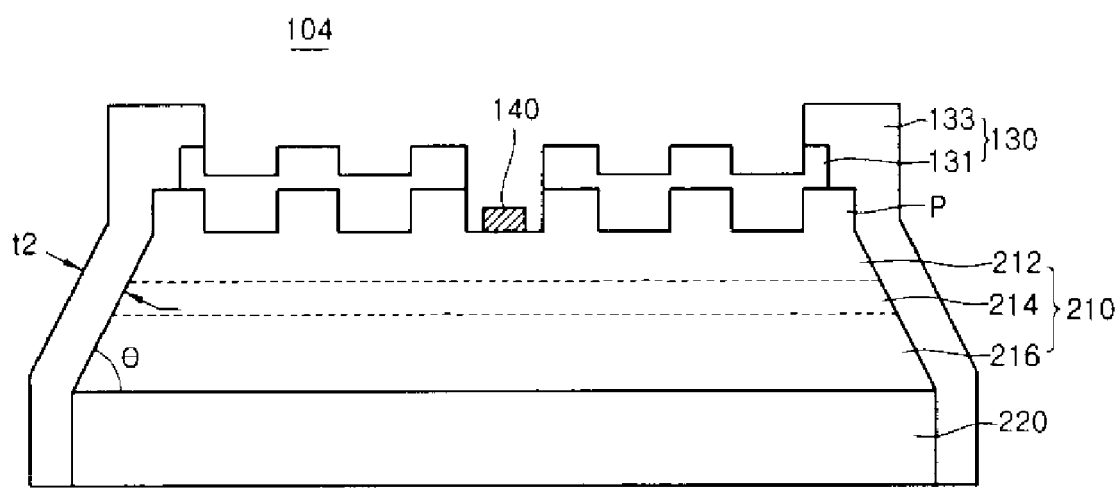

[FIG. 9]
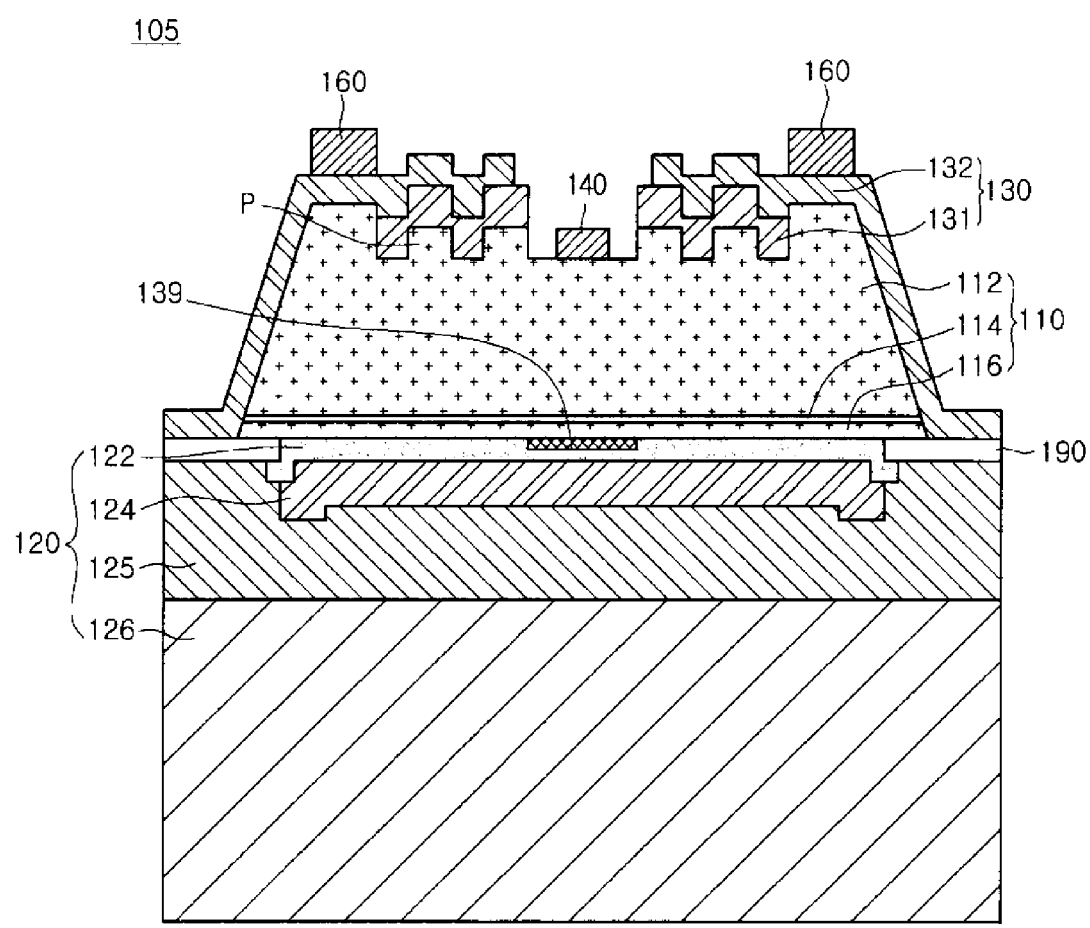

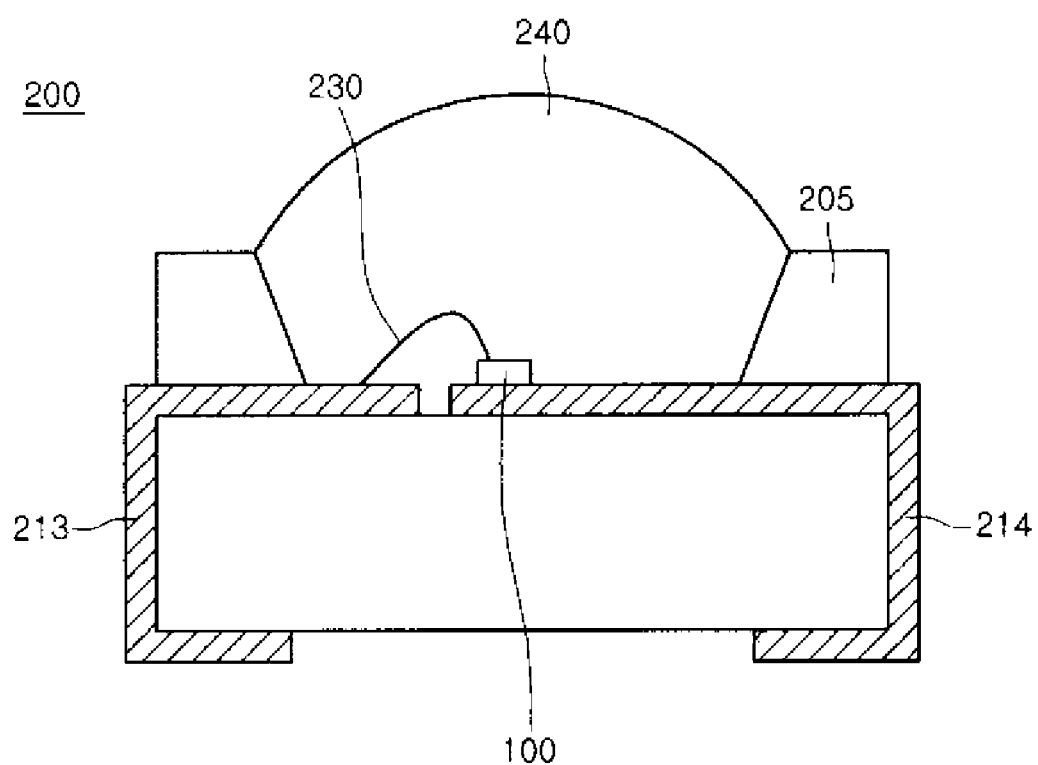
[FIG. 10]

[FIG. 11]
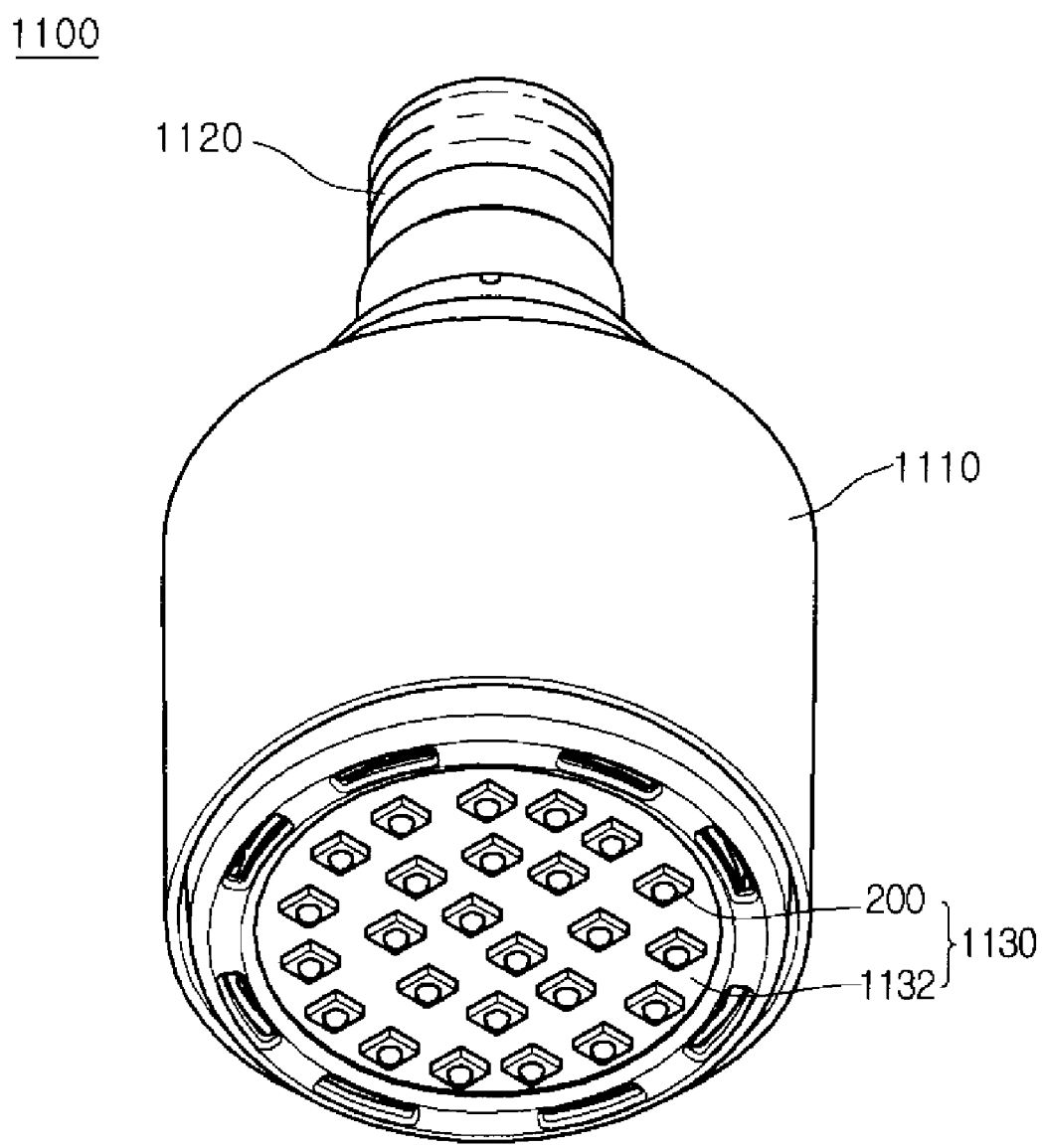

[FIG. 12]
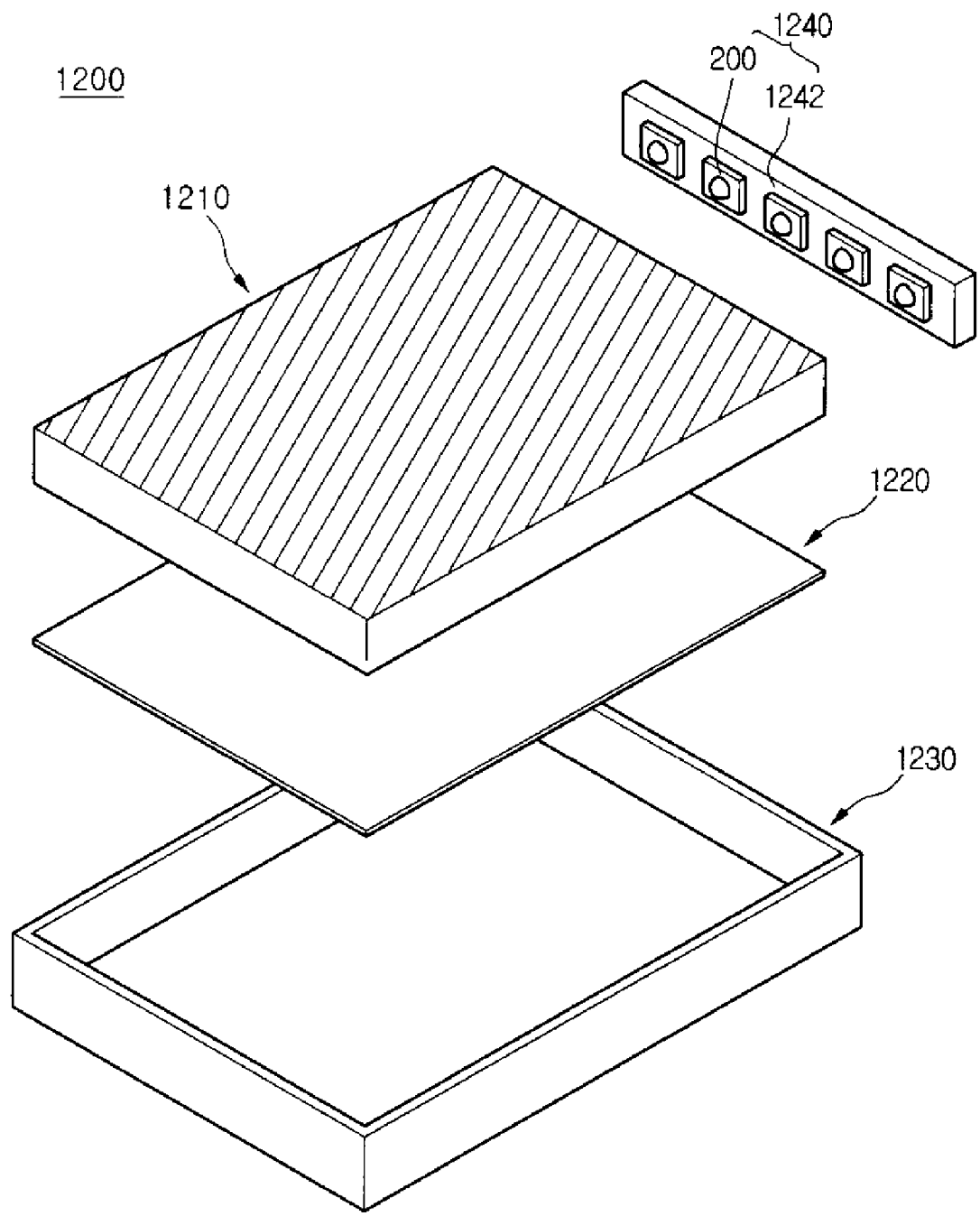

LIGHT EMITTING DEVICE HAVING A LATERAL PASSIVATION LAYER

CROSS-REFERENCE TO RELATED APPLICATIONS

This application is a continuation of U.S. application Ser. No. 13/016,217 filed on Jan. 28, 2011 now U.S. Pat. No. 8,071,973 claiming the benefit of Korean Patent Application No. 10-2010-0009211 filed Feb. 1, 2010, both of which are hereby incorporated by reference for all purpose as if fully set forth herein.

BACKGROUND

Embodiments relate to a light emitting device, a light emitting device package, and a lighting system.

In light emitting devices, P-N junction diodes having the properties of converting electrical energy into light energy may be formed by combining group III and V elements on the periodic table. Light emitting devices may realize various colors by controlling the composition ratio of compound semiconductors.

Nitride semiconductors are attracting much attention for the fields of optical devices and high-power electronic devices because of their high thermal stability and wide band gap energy. In particular, blue light emitting devices, green light emitting devices, and UV light emitting devices, which use nitride semiconductors have been commercialized and are widely used.

According to a related art, a passivation layer is disposed on a side surface of a light emitting device. When a single-layered passivation layer having the same refractive index is disposed on a side surface and a top surface of the light emitting device, it is difficult to obtain an optimized light amount. This is done because a reflective index layer satisfying an anti-reflection coating condition is disposed on a side surface and an optimized reflective index layer on the top surface is changed according to a period of a light extraction pattern.

Since diffraction efficiency of the light extraction pattern depends on a refractive index of an interface, a refractive index of the passivation layer filling the pattern may become an important parameter.

SUMMARY

Embodiments provide a light emitting device, which can obtain an optimized light amount, a light emitting device package, and a lighting system.

In one embodiment, a light emitting device includes: a light emitting structure including a first conductive type semiconductor layer, a second conductive type semiconductor layer, and an active layer between the first conductive type semiconductor layer and the second conductive type semiconductor layer; and a passivation layer protecting a surface of the light emitting structure, wherein the passivation layer includes: a first passivation layer on a top surface of the light emitting structure; and a second passivation layer having a refractive index different from that of the first passivation layer, the second passivation layer being disposed on a side surface of the light emitting structure, wherein the second passivation layer has a refractive index greater than that of the first passivation layer.

In another embodiment, a light emitting device includes: a light emitting structure including a first conductive type semiconductor layer, a second conductive type semiconductor layer, and an active layer between the first conductive type semiconductor layer and the second conductive type semiconductor layer; and a passivation layer protecting a surface of the light emitting structure, wherein the passivation layer includes: a first passivation layer on a top surface of the light emitting structure; and a second passivation layer having a refractive index different from that of the first passivation layer, the second passivation layer being disposed on a side surface of the light emitting structure, wherein the second passivation layer may satisfy an anti-reflection coating condition.

In further another embodiment, a light emitting device includes: a light emitting structure including a first conductive type semiconductor layer, a second conductive type semiconductor layer, and an active layer between the first conductive type semiconductor layer and the second conductive type semiconductor layer; and a passivation layer protecting a surface of the light emitting structure, wherein the passivation layer includes: a first passivation layer on a top surface of the light emitting structure; and a second passivation layer having a refractive index different from that of the first passivation layer, the second passivation layer being disposed on a side surface of the light emitting structure, wherein the second passivation layer may have a thickness of $(\lambda/4n) \times (2m+1)$ (where, $\lambda$ is a wavelength of light emitted from the active layer, n is a refractive index of the light emitting structure, and m is zero or a positive integer).

In still further another embodiment, a light emitting device includes: a light emitting structure including a first conductive type semiconductor layer, a second conductive type semiconductor layer, and an active layer between the first conductive type semiconductor layer and the second conductive type semiconductor layer; and a passivation layer protecting a surface of the light emitting structure, wherein the passivation layer includes: a first passivation layer on a top surface of the light emitting structure; and a second passivation layer having a refractive index different from that of the first passivation layer, the second passivation layer being disposed on a side surface of the light emitting structure, wherein a light extraction structure is disposed on the light emitting structure.

In even further another embodiment, a light emitting device includes: a light emitting structure including a first conductive type semiconductor layer, a second conductive type semiconductor layer, and an active layer between the first conductive type semiconductor layer and the second conductive type semiconductor layer; and a passivation layer protecting a surface of the light emitting structure, wherein the passivation layer includes: a first passivation layer on a top surface of the light emitting structure; and a second passivation layer having a refractive index different from that of the first passivation layer, the second passivation layer being disposed on a side surface of the light emitting structure, wherein at least one layer of the first passivation layer and the second passivation layer may include the light extraction structure on a surface thereof.

In yet further another embodiment, a light emitting device includes: a light emitting structure including a first conductive type semiconductor layer, a second conductive type semiconductor layer, and an active layer between the first conductive type semiconductor layer and the second conductive type semiconductor layer; and a passivation layer protecting a surface of the light emitting structure, wherein the passivation layer includes: a first passivation layer on a top surface of the light emitting structure; and a second passivation layer having a refractive index different from that of the first passivation layer, the second passivation layer being disposed on a side surface of the light emitting structure, wherein the light emitting structure has an inclined side surface.

The details of one or more embodiments are set forth in the accompanying drawings and the description below. Other features will be apparent from the description and drawings, and from the claims.

BRIEF DESCRIPTION OF THE DRAWINGS

FIG. 1 is a sectional view of a light emitting device according to a first embodiment.

FIGS. 2 to 5 are sectional views illustrating a process of manufacturing the light emitting device according to the first embodiment.

FIG. 6 is a sectional view of a light emitting device according to a second embodiment.

FIG. 7 is a sectional view of a light emitting device according to a third embodiment.

FIG. 8 is a sectional view of a light emitting device according to a fourth embodiment.

FIG. 9 is a sectional view of a light emitting device according to a fifth embodiment.

FIG. 10 is a sectional view of a light emitting device package according to an embodiment.

FIG. 11 is a perspective view of a lighting unit according to an embodiment.

FIG. 12 is an exploded perspective view of a backlight unit according to an embodiment.

DETAILED DESCRIPTION OF THE EMBODIMENTS

Hereinafter, a light emitting device, a light emitting device package, and a lighting system according to an embodiment will be described with reference to accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Embodiments

FIG. 1 is a sectional view of a light emitting device according to a first embodiment.

A light emitting device 101 according to embodiments may include a light emitting structure 110, a first passivation layer 131 on a top surface of the light emitting structure 110, and a second passivation layer 132 on a side surface of the light emitting structure 110.

The second passivation layer 132 may be disposed on the first passivation layer 131 on the top surface of the light emitting structure 110.

The second passivation layer 132 may have a refractive index greater than that of the first passivation layer 131, but is not limited thereto.

The second passivation layer 132 may have a thickness less than that of the first passivation layer 131, but is not limited thereto.

The first passivation layer 131 may have a refractive index less than that of the light emitting structure 110.

The second passivation layer 132 may be formed to satisfy an anti-reflection coating condition.

For example, the second passivation layer 132 may have a thickness of $(\lambda/4n)+(2m+1)$ (where, $\lambda$ is a wavelength of light emitted from an active layer 114, n is a refractive index of the light emitting structure 110, and m is zero or a positive integer).

The current embodiment may include a light extraction structure P on the light emitting structure 110.

The first passivation layer 131 may be disposed along a surface shape of the light extraction structure P.

Also, according to the current embodiment, a side surface of the light emitting structure 110 may be inclined as shown in FIGS. 7 and 8.

In this case, the second passivation layer 132 may have a thickness of $(\lambda/4n) \times (2m+1)/\cos(x)$ (where, m is zero or a positive integer, x is an angle between zero and $\theta$, and $\theta$ is an inclined angle of the side surface of the light emitting structure).

The current embodiment may introduce a passivation layer 130 to prevent a leakage current of an LED chip from occurring.

Since band gaps of electrons are disposed with spatial periodicity in a quantum well layer of a light emitting device, the periodicity may be broken when the quantum well layer is exposed to the outside in an isolation process. Thus, a new energy level may be generated around the band gap.

The generated energy level is referred to as a surface state. Since the surface state generally undergoes a non-radiative recombination process, electrons supplied to the surface state does not generate light, but is converted into heat. Thus, when a current is injected into the light emitting device, the quantum well layer around a side surface of an isolation layer may be degraded. The degradation of the quantum well layer may affect reliability of the device. To solve such a limitation, the side surface of the quantum well layer exposed to the outside may be protected by a dielectric material. Such a dielectric layer may be referred to as a passivation layer.

The passivation layer may be formed of an oxide-, nitride-, or fluoride-based compound, but is not limited thereto.

In case of a vertical type GaN LED, a passivation layer may cover side surfaces and a top surface of a chip. Since the passivation layer is disposed within a light emitting path, a refractive index and a light absorption of the passivation layer may be important parameters with respect to an amount of light. Specifically, since the passivation layer disposed on the top surface of the light emitting structure contacts a light extraction pattern, functions of the passivation may be very important.

According to the current embodiment, in a multi-passivation layer 130, the first passivation layer 131 contacting the light extraction structure P disposed on a top surface of the light emitting device chip may be disposed, and then, the second passivation layer 132 contacting a side surface of the light extraction structure P may be disposed.

Here, the first passivation and the second passivation 132 may have refractive indexes different from each other. For example, the first passivation layer 131 may have a refractive index between about 1.4 to about 2.0 according a period of the light extraction structure P, but is not limited thereto.

Also, the second passivation layer 132 may have a refractive index of about 1.57 (in a case where a background material is air) or about 1.89 (in a case where a background material is Si gel, where it is assumed that n=1.45) to satisfy an anti-reflection condition (a geometric mean of refractive indexes of both materials constituting an interface) according to the refractive indexes of the background materials, but is not limited thereto. Here, it may be assumed that the light emitting structure is formed of GaN and the GaN has a refractive index of about 2.46, but is not limited thereto.

According to the current embodiment, the second passivation layer 132 disposed on the side surfaces of the light emitting structure may satisfy the anti-reflection coating condition. However, the first passivation layer 131 disposed on the top surface of the light emitting structure may be formed of a material having a refractive index less than that of the second passivation in consideration of the refractive index of the light emitting structure and the period of the light extraction structure to obtain optimized light extraction efficiency.

In the light emitting device according to the current embodiment, the multi-passivation layer having the refractive indexes different from each other may be disposed on the side surface and the top surface of the light emitting structure to obtain an optimized light amount.

Hereinafter, a process of manufacturing a light emitting device according to a first embodiment will be described with reference to FIGS. 2 to 5.

First, a light emitting structure 110 is formed. For example, the light emitting structure 110 may include a first conductive type semiconductor layer 112, an active layer 114, and a second conductive type semiconductor layer 116.

First, a first substrate (not shown) is prepared as shown in FIG. 2. The first substrate may include a conductive substrate or an insulative substrate. For example, the first substrate may be formed of at least one of sapphire ($Al_2O_3$), SiC, GaAs, GaN, ZnO, Si, GaP, InP, Ge, and $Ga_2O_3$. A roughness structure may be formed on the first substrate, but is not limited thereto.

A wet etching process may be performed on the first substrate to remove impurities on the first substrate.

Thereafter, the light emitting structure 110 including the first conductive type semiconductor layer 112, the active layer 114, and the second conductive type semiconductor layer 116 may be formed on the first substrate.

For example, the light emitting structure 110 may be formed using one of a metal organic chemical vapor deposition (MOCVD) process, a chemical vapor deposition (CVD) process, a plasma-enhanced chemical vapor deposition (PECVD) process, a molecular beam epitaxy (MBE) process, and a hydride vapor phase epitaxy (HVPE) process, but is not limited thereto.

A buffer layer (not shown) may be formed on the first substrate. The buffer layer may reduce a lattice mismatch between a material of the light emitting structure 110 and the first substrate. The buffer layer may be formed of a group III-V compound semiconductor, e.g., at least one of GaN, InN, AlN, InGaN, AlGaN, InAlGaN, and AlInN. An undoped semiconductor layer may be formed on the buffer layer, but is not limited thereto.

The first conductive type semiconductor layer 112 may be formed of a group III-V compound semiconductor doped with a first conductive type dopant. When the first conductive type semiconductor layer 112 is an N-type semiconductor layer, the first conductive type dopant may include Si, Ge, Sn, Se, or Te as an N-type dopant, but is not limited thereto.

The first conductive type semiconductor layer 112 may be formed of a semiconductor material having a compositional formula of $In_xAl_yGa_{1-x-y}N$ ($0 \leq x \leq 1$, $0 \leq y \leq 1$, $0 \leq x+y \leq 1$).

The first conductive type semiconductor layer 112 may be formed of one of GaN, InN, AlN, InGaN, AlGaN, InAlGaN, AlInN, AlGaAs, InGaAs, AlInGaAs, GaP, AlGaP, InGaP, AlInGaP, and InP.

The first conductive type semiconductor layer 112 may form an N-type GaN layer using the CVD process, the MBE process, a sputtering process, or the HVPE process. Also, the first conductive type semiconductor layer 112 may be formed by injecting silane gas ($SiH_4$) containing n-type impurities such as trimethyl gallium (TMGa) gas, ammonia ($NH_3$) gas, nitrogen ($N_2$) gas, and silicon (Si).

The active layer 114 is a layer in which electrons injected through the first conductive type semiconductor layer 112 meet with holes injected through the second conductive type semiconductor layer 116 to emit light having energy determined by a proper energy band of the active layer (light emitting layer) material.

The active layer 114 may have at least one of a single quantum well structure, a multi quantum well (MQW) structure, a quantum-wire structure, and a quantum dot structure. For example, the active layer 114 may have the MQW structure by injecting trimethyl gallium (TMGa) gas, ammonia ($NH_3$) gas, nitrogen ($N_2$) gas, and trimethyl indium (TMIn) gas, but is not limited thereto.

A well layer/barrier layer of the active layer 114 may have a pair structure with at least one of InGaN/GaN, InGaN/InGaN, AlGaN/GaN, InAlGaN/GaN, GaAs(InGaAs)/AlGaAs, and GaP(InGaP)/AlGaP, but is not limited thereto. The well layer may be formed of a material having a band gap less than that of the barrier layer.

A conductive type clad layer may be formed on or/and under the active layer 114. The conductive type clad layer may be formed of an AlGaN-based semiconductor and have a band gap greater than that of the active layer 114.

The second conductive type semiconductor layer 116 may be formed of a group III-V compound semiconductor doped with a second conductive type dopant, e.g., a semiconductor material having a compositional formula of $In_xAl_yGa_{1-x-y}N$ ($0 \leq x \leq 1$, $0 \leq y \leq 1$, $0 \leq x+y \leq 1$). For example, the second conductive type semiconductor layer 116 may be formed of one of GaN, AlN, AlGaN, InGaN, InN, InAlGaN, AlInN, AlGaAs, GaP, GaAs, GaAsP, and AlGaInP. When the second conductive type semiconductor layer 116 is a P-type semiconductor layer, the second conductive type dopant may include Mg, Zn, Ca, Sr, or Ba as a P-type dopant. The second conductive type semiconductor layer 116 may have a single-layered or multi-layered structure, but is not limited thereto.

The second conductive type semiconductor layer 116 may form a P-type GaN layer by injecting trimethyl gallium (TMGa) gas, ammonia ($NH_3$) gas, nitrogen ($N_2$) gas, and trimethyl indium (TMIn) gas, and bis-ethyl-cyclopentadienyl-magnesium ($EtCp_2Mg$) {$Mg(C_2H_5C_5H_4)_2$} containing P-type impurities such as magnesium (Mg) into a chamber, but is not limited thereto.

In the current embodiment, the first conductive type semiconductor layer 112 may be realized as an N-type semiconductor layer, and the second conductive type semiconductor layer 126 may be realizes as a P-type semiconductor layer, but are not limited thereto. Also, a semiconductor layer having a polarity opposite to that of the second conductive type, e.g., an N-type semiconductor layer (not shown) may be formed on the second conductive type semiconductor layer 116. Thus, the light emitting structure 110 may have one of an N-P junction structure, a P-N junction structure, an N-P-N junction structure, and a P-N-P junction structure.

Thereafter, a second electrode layer 120 is formed on the second conductive type semiconductor layer 116.

The second electrode layer 120 may include an ohmic layer (not shown), a reflective layer (not shown), an adhesion layer (not shown), and a conductive support layer (not shown).

For example, the second electrode layer 120 may include the ohmic layer (not shown). The ohmic layer ohmic-contacts the light emitting structure 110 to smoothly supply a power to the light emitting structure 110. Also, the ohmic layer may be formed by multiply stacking a single metal or a metal alloy and a metal oxide.

For example, the ohmic layer may be formed of at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO Nitride (IZON), Al—Ga ZnO (AGZO), In—Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, and Hf, but is not limited thereto.

The second electrode layer 120 includes the reflective layer (not shown) to reflect light incident from the light emitting structure 110, thereby improving the light extraction efficiency.

For example, the reflective layer may be formed of a metal or alloy including at least one of Ag, Ni, Al, Rh, Pd, Ir, Ru, Mg, Zn, Pt, Au, Hf. Also, the reflective layer may be formed in a multi-layered structure using the metal or alloy and a light-transmitting conductive material such as IZO, IZTO, IAZO, IGZO, IGTO, AZO, or ATO. For example, the reflective layer may have a stacked structure of IZO/Ni, AZO/Ag, IZO/Ag/Ni, or AZO/Ag/Ni.

When the second electrode layer 120 includes the adhesion layer, the reflective layer may serve as an adhesion layer or include a barrier metal or a bonding metal. For example, the adhesion layer may be formed of at least one of Tl, Au, Sn, Ni, Cr, Ga, In, Bi, Cu, Ag and Ta.

The second electrode layer 120 may include the conductive support substrate. The conductive support substrate supports the light emitting structure 110 and provides a power to the light emitting structure 110. The conductive support substrate may be formed of a metal, a metal alloy, or a conductive semiconductor material, which has superior conductivity.

For example, the conductive support substrate may be formed of at least one of copper (Cu), a copper alloy, gold (Au), nickel (Ni), molybdenum (Mo), copper-tungsten (Cu—W), and a carrier wafer (e.g., Si, Ge, GaAs, GaN, ZnO, SiGe, or SiC).

The conductive support substrate may have a thickness, which is varied according to the design of the light emitting device 110. For example, the conductive support substrate may have a thickness of about 30 μm to 500 μm.

A process of forming the conductive support substrate may include an electrochemical metal deposition process, a plating process, and a bonding process using a eutectic metal.

Thereafter, the first substrate is removed to expose the first conductive type semiconductor layer 112. The first substrate may be removed using a laser lift off process or a chemical lift off process. Alternatively, the first substrate may be removed through physical grinding.

Next, the current embodiment may include a process of forming a light extraction structure P on the light emitting structure 110 after the forming of the light emitting structure 110.

For example, the light extraction structure P may have an unevenness or optical crystal structure, but is not limited thereto. The light extraction structure P may be formed through a wet etching or dry etching process.

Next, a passivation layer 130 is formed on the light emitting structure 110.

In the current embodiment, a first passivation layer 131 may be firstly disposed on a top surface contacting the light extraction structure P, and a second passivation layer 132 surrounding side surfaces of the first passivation layer 131 and the light emitting structure 110 may be additionally disposed.

For example, as shown in FIG. 3, the first passivation layer 131 is formed on the top surface of the light emitting structure 110. Here, since the first passivation layer 131 is formed along a surface shape of the light extraction structure P to allow a surface of the first passivation layer 131 to maintain the surface shape of the light extraction structure P, the light extraction efficiency may be improved.

In the current embodiment, the first passivation layer 131 may have a refractive index less than that of the light emitting structure 110.

In the current embodiment, the first passivation layer 131 may have an optimized refractive index, which is differently set according to a period of the light extraction structure P contacting the first passivation layer 131.

For example, the first passivation layer 131 may have a refractive index between about 1.4 to about 2.0 according to the period of the light extraction structure P, but is not limited thereto.

Next, as shown in FIG. 4, the second passivation layer 132 may be formed on a side surface of the light emitting structure 110.

The second passivation layer 132 may be formed also on the first passivation layer 131 formed on the top surface of the light emitting structure 110.

The second passivation layer 132 may be formed along the surface shape of the first passivation layer 131 to improve the light extraction efficiency.

Also, when a predetermined mask pattern (not shown) may be formed, the second passivation layer 132 may not be formed in a pad electrode region that will be formed later, but is not limited thereto.

In the current embodiment, the second passivation layer 132 may have a refractive index greater than that of the first passivation layer 131, but is not limited thereto.

Also, the second passivation layer 132 may be formed to satisfy an anti-reflection coating condition, but is not limited thereto. Also, the second passivation layer 132 may have a refractive index less than that of the light emitting structure 110.

For example, the second passivation layer 132 may have a refractive index of about 1.57 (in a case where a background material is air) or about 1.89 (in a case where a background material is Si gel, where it is assumed that n=1.45) to satisfy an anti-reflection condition (a geometric mean of refractive indexes of both materials constituting an interface) according to the refractive indexes of the background materials, but is not limited thereto. Here, it may be assumed that the light emitting structure is formed of GaN and the GaN has a refractive index of about 2.46, but is not limited thereto.

In the first embodiment, the second passivation layer 132 may have a thickness of $(\lambda/4n) \times (2m+1)$ (where, $\lambda$ is a wavelength of light emitted from an active layer, n is a refractive index of the light emitting structure, and m is zero or a positive integer).

According to the current embodiment, the second passivation layer 132 disposed on the side surfaces of the light emitting structure may satisfy the anti-reflection coating condition. However, the first passivation layer 131 disposed on the top surface of the light emitting structure may be formed of a material having a refractive index less than that of the second passivation in consideration of the refractive index of the light emitting structure and the period of the light extraction structure to obtain optimized light extraction efficiency.

Next, as shown in FIG. 5, a portion of the first passivation layer 131 in the pad electrode region may be removed to expose the top surface of the light emitting structure, thereby forming a pad electrode 140.

In the light emitting device according to the current embodiment, the multi-passivation layer having the refractive indexes different from each other may be disposed on the side surface and the top surface of the light emitting structure to obtain an optimized light amount.

FIG. 6 is a sectional view of a light emitting device 102 according to a second embodiment.

A second embodiment may adopt the technical features of the first embodiment.

In the second embodiment, a third passivation layer 133 may be mainly disposed on a side surface of a light emitting structure 110. Also, the third passivation layer 133 may not be hardly disposed on a top surface of the light emitting structure. As shown in FIG. 6, the third passivation layer 133 may partially overlap a first passivation layer 131, but is not limited thereto.

According to the second embodiment, the first passivation layer 131 may be formed of a material adequate for improving light extraction efficiency. Also, the third passivation layer 133 may be formed of a material, which satisfies an anti-reflection coating condition. Thus, the passivation layers may be formed of the materials adequate for each passivation function to optimize the light extraction efficiency.

FIG. 7 is a sectional view of a light emitting device 103 according to a third embodiment.

A third embodiment may adopt the technical features of the first embodiment.

The third embodiment may include a light emitting structure 210 having an inclined side surface to expand a range of an escape cone, thereby improving light extraction efficiency.

The inclined side surface of the light emitting structure 210 may be formed by performing an etching process in consideration of a proper crystal orientation of a material of the light emitting structure 210.

In the third embodiment, a second passivation layer 132 may have a thickness of $(\lambda/4n) \times (2m+1)$ (where, $\lambda$ is a wavelength of light emitted from an active layer, n is a refractive index of the light emitting structure, and m is zero or a positive integer).

According to the third embodiment, in a case where a chip has an mesa angle $\theta$ in shape, a thickness t2 of the second passivation layer 132 may be increased to $(\lambda/4n) \times (2m+1)/\cos(x)$ (where, m is zero or a positive integer, x is an angle between zero and $\theta$, and $\theta$ is an inclined angle of the side surface of the light emitting structure).

A second electrode layer 220 may be disposed under the light emitting structure 210.

FIG. 8 is a sectional view of a light emitting device 104 according to a fourth embodiment. A fourth embodiment may adopt the technical features of the second embodiment.

The fourth embodiment may include a light emitting structure 210 having an inclined side surface to expand a range of an escape cone, thereby improving light extraction efficiency. The inclined side surface of the light emitting structure 210 may be formed by performing an etching process in consideration of a proper crystal orientation of a material of the light emitting structure 210. A second electrode layer 220 may be disposed under the light emitting structure 210.

According to the fourth embodiment, in a case where a chip has an mesa angle $\theta$ in shape, a thickness t2 of the second passivation layer 132 may be increased to $(\lambda/4n) \times (2m+1)/\cos(x)$ (where, m is zero or a positive integer, x is an angle between zero and $\theta$, and $\theta$ is an inclined angle of the side surface of the light emitting structure).

FIG. 9 is a sectional view of a light emitting device 105 according to a fifth embodiment.

A fifth embodiment may adopt the technical features of the fourth embodiment.

The light emitting device 105 according to the fifth embodiment may include a light emitting structure 110 including a first conductive type semiconductor layer 112, an active layer 114, and a second conductive type semiconductor layer 116 and a pad electrode 160 on a portion of a top surface of the light emitting structure 110.

According to the fifth embodiment, in a multi-passivation layer 130, a first passivation layer 131 contacting a light extraction structure P disposed on a top surface of the light emitting device chip may be disposed, and then, a second passivation layer 132 contacting a side surface of the light extraction structure P may be disposed.

The current embodiment may include a first electrode 140 on the light emitting structure 110. The pad electrode 160 may be electrically connected to the first electrode 140.

The light extraction structure P may be disposed on the top surface of the light emitting structure 110 to improve light extraction efficiency.

A second electrode layer 120 may be disposed under the light emitting structure 110. The second electrode layer 120 may include an ohmic layer 122, a reflective layer 124, a coupling layer 125, and a support substrate 126.

A protection member 190 may be disposed outside a lower side of the light emitting structure 110. A current blocking layer may be disposed between the light emitting structure 110 and the ohmic layer 122.

The protection member 190 may be disposed in a circumference region between the light emitting structure 110 and the coupling layer 125. Thus, the protection member 190 has a ring shape, a loop shape, or a square frame shape. A portion of the protection member 190 may vertically overlap the light emitting structure 110.

The protection member 190 may increase a distance between side surfaces of the coupling layer 125 and the active layer 114 to prevent the coupling layer 125 and the active layer 114 from being electrically short-circuited to each other.

Also, the protection member 190 may prevent electrical short-circuit from occurring in a chip separation process.

The protection member 190 may be formed of an insulative material, a material having conductivity less than that of the reflective layer 124 or the coupling layer 125, or a material, which forms schottky contact with the second conductive type semiconductor layer 116. For example, the protection member 190 may be formed of at least one of ITO, IZO, IZTO, IAZO, IGZO, IGTO, AZO, ATO, ZnO, SiO2, $SiO_x$, $SiO_xN_y$, $Si_3N_4$, $Al_2O_3$, $TiO_x$, $TiO_2$, Ti, Al, and Cr.

FIG. 10 is a sectional view of a light emitting device package including the light emitting device according to the embodiments.

Referring to FIG. 10, a light emitting device package according to the embodiments includes a package body 205, a third electrode layer 213 and a fourth electrode layer 214 disposed on the package body 205, a light emitting device 100 disposed on the package body 205 and electrically connected to the third electrode layer 213 and the fourth electrode layer 214, and a molding member 240 surrounding the light emitting device 100.

The package body 205 may be formed of a silicon material, a synthetic resin material, or a metal material. An inclined surface may be disposed around the light emitting device 100.

The third electrode layer 213 and the fourth electrode layer 214 are electrically separated from each other and supply a power to the light emitting device 100. Also, the third electrode layer 213 and the fourth electrode layer 214 may reflect light generated in the light emitting device 100 to improve light efficiency, and may release heat generated in the light emitting device 100 to the outside.

The light emitting device 100 may be applicable to a vertical type light emitting device of FIG. 1, 6, 7, or 8, but is not limited thereto.

The light emitting device 100 may be disposed on the package body 205 or on the third electrode layer 213 or the fourth electrode layer 214.

The light emitting device 100 may be electrically connected to the third electrode layer 213 or/and the fourth electrode layer 214 using one of a wire-bonding method, a flip-chip method, and a die bonding method. In the current embodiment, the light emitting device 100 may be electrically connected to the third electrode layer 213 through a wire. Also, the light emitting device 100 may be directly contact the fourth electrode layer 214 and thus electrically connected to the fourth electrode layer 214.

The molding member 240 may surround the light emitting device 100 to protect the light emitting device 100. Also, the molding member 240 may include a phosphor to vary a wavelength of light emitted from the light emitting device 100.

A plurality of light emitting device packages according to the embodiments may be arrayed on a board. Also, optical members such as a light guide plate, a prism sheet, a diffusion sheet, and a fluorescence sheet may be disposed on a path of light emitted from the light emitting device packages. The light emitting device package, the board and the optical members may function as a backlight unit or lighting unit. For example, the lighting system may include a backlight unit, a lighting unit, an indicator unit, a lamp, a streetlamp, etc.

FIG. 11 is a perspective view of a lighting unit 1100 according to an embodiment. The lighting unit 1110 shown in FIG. 11 is an example of the lighting system, but is not limited thereto.

Referring to FIG. 11, the lighting unit 1100 may include a case body 1110, a light emitting module 1130 disposed in the case body 1110, and a connection terminal 1120 disposed in the case body 1110 to receive a power from an external power source.

The case body 1110 may be formed of a material having an improved heat dissipation characteristic. For example, the case body 1110 may be formed of a metal material or resin material.

The light emitting module 1130 may include a board 1132 and at least one light emitting device package 200 mounted on the board 1132.

A circuit pattern may be printed on an insulator to form the board 1132. For example, the board 1132 may include a printed circuit board (PCB), a metal core PCB, a flexible PCB, or a ceramic PCB.

Also, the substrate 1132 may be formed of a material that can effectively reflect light. A surface of the substrate 1132 may be coated with a colored material, e.g., a white or silver-colored material by which light is effectively reflected.

The light emitting device package 200 may be mounted on the board 1132. The light emitting device package 200 may include at least one light emitting diode (LED) 100. The light emitting diode 100 may include a colored light emitting diode that emits red, green, blue, or white light, and an UV light emitting diode that emits ultraviolet (UV) light.

The light emitting module 1130 may include a plurality of light emitting device packages 200 to obtain various colors and brightness. For example, a white light emitting device, a red light emitting device, and a green light emitting device may be disposed in combination with each other to secure a high color rendering index (CRI).

The connection terminal 1120 may be electrically connected to the light emitting module 1130 to supply a power. As shown in FIG. 11, although the connection terminal 1120 is screw-inserted into an external power source in a socket manner, the present disclosure is not limited thereto. For example, the connection terminal 1120 may have a pin shape. Thus, the connection terminal 1120 may be inserted into the external power source or connected to the external power source using an interconnection.

FIG. 12 is an exploded perspective view of a backlight unit 1200 according to an embodiment. The backlight unit 1200 shown in FIG. 12 is an example of the lighting system, but is not limited thereto.

A backlight unit 1200 according to an embodiment may include a light guide plate 1210, a light emitting module 1240, a reflective member 1220, and a bottom cover 1230, but is not limited thereto. The light emitting module 1240 may provide light to the light guide plate 1210. The reflective member 1220 may be disposed below the light guide plate 1210. The bottom cover 1230 may receive the light guide plate 1210, the light emitting module 1240, and the reflective member 1220.

The light guide plate 1210 diffuses light to produce planar light. The light guide plate 1210 may be formed of a transparent material. For example, the light guide plate 1210 may be formed of one of an acrylic resin-based material such as polymethylmethacrylate (PMMA), a polyethylene terephthalate (PET) resin, a poly carbonate (PC) resin, a cyclic olefin copolymer (COC) resin, and a polyethylene naphthalate (PEN) resin.

The light emitting module 1240 provides light to at least one surface of the light guide plate 1210. Thus, the light emitting module 1240 may be used as a light source of a display device including the backlight unit.

The light emitting module 1240 may contact the light guide plate 1210, but is not limited thereto. In particular, the light emitting module 1240 may include a substrate 1242 and a plurality of LIGHT EMITTING DEVICE packages 200 mounted on the substrate 1242. The substrate 1242 may contact the light guide plate 1210, but is not limited thereto.

The substrate 1242 may be a PCB including a circuit pattern (not shown). However, the substrate 1242 may include a metal core PCB or a flexible PCB as well as the PCB, but is not limited thereto.

The light emitting device packages 200 may have light emitting surfaces that emit light on the substrate 1242 and are spaced a predetermined distance from the light guide plate 1210.

The reflective member 1220 may be disposed below the light guide plate 1210. The reflective member 1220 reflects light incident onto a bottom surface of the light guide plate 1210 to proceed in an upward direction, thereby improving brightness of the backlight unit. For example, the reflective member may be formed of one of PET, PC, and PVC, but is not limited thereto.

The bottom cover 1230 may receive the light guide plate 1210, the light emitting module 1240, and the reflective member 1220. For this, the bottom cover 1230 may have a box shape with an open upper side, but is not limited thereto.

The bottom cover 1230 may be formed of a metal material or a resin material. Also, the bottom cover 1230 may be manufactured using a press forming process or an extrusion molding process.

In the light emitting device, the light emitting device package, and the lighting system according to the embodiments, the multi-passivation layer having the refractive indexes different from each other may be disposed on the side surface and the top surface of the light emitting structure may be provided to obtain the optimized light amount.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
   a light emitting structure comprising a first conductive type semiconductor layer, a second conductive type semiconductor layer, and an active layer between the first conductive type semiconductor layer and the second conductive type semiconductor layer; and,
   a passivation layer on the light emitting structure,
   wherein the passivation layer comprises:
   a first passivation layer on a top surface of the light emitting structure; and
   a second passivation layer having a refractive index different from that of the first passivation layer, the second passivation layer being disposed on a side surface of the light emitting structure.

2. The light emitting device of claim 1, wherein the second passivation layer has a refractive index greater than that of the first passivation layer.

3. The light emitting device of claim 1, wherein the second passivation layer is formed also on the first passivation layer disposed on the top surface of the light emitting structure.

4. The light emitting device of claim 1, wherein the first passivation layer has a refractive index less than that of the light emitting structure.

5. The light emitting device of claim 1, wherein the second passivation layer has a thickness of $(\lambda/4n)\times(2m+1)$ (where, $\lambda$ is a wavelength of light emitted from the active layer, n is a refractive index of the light emitting structure, and m is zero or a positive integer).

6. The light emitting device of claim 1, further comprising a light extraction structure on the light emitting structure.

7. The light emitting device of claim 6, wherein at least one layer of the first passivation layer and the second passivation layer comprises the light extraction structure on a surface thereof.

8. The light emitting device of claim 1, wherein at least one layer of the first passivation layer and the second passivation layer comprises the light extraction structure on a surface thereof, and the light extraction structure on the surface of the at least one layer of the first passivation layer and the second passivation layer is disposed along with a shape of the light extraction structure on the light emitting structure.

9. The light emitting device of claim 1, wherein the light emitting structure comprises an inclined side surface.

10. The light emitting device of claim 1, wherein the second passivation layer has a thickness of $(\lambda/4n)\times(2m+1)/\cos(x)$ (where, m is zero or a positive integer, x is an angle between zero and $\theta$, and $\theta$ is an inclined angle of the side surface of the light emitting structure).

11. The light emitting device of claim 1, wherein the second passivation layer includes an anti-reflection coating condition.

12. The light emitting device of claim 1, further comprising a second electrode layer under the light emitting structure.

13. The light emitting device of claim 12, wherein the second electrode layer comprises at least one of an ohmic layer, a reflective layer, a coupling layer, and a support substrate.

14. The light emitting device of claim 13, further comprising a protection member outside a lower side of the light emitting structure,
   wherein the protection member is disposed in a circumference region between the light emitting structure and the coupling layer.

15. The light emitting device of claim 14, wherein the protection member comprises a ring shape, a loop shape, or a square frame shape.

16. The light emitting device of claim 14, wherein a portion of the protection member is vertically overlap the light emitting structure.

17. The light emitting device of claim 12, further comprising a current blocking layer between the light emitting structure and the second electrode layer.

* * * * *